(12) United States Patent
Li (10) Patent No.: US 11,290,075 B2
(45) Date of Patent: Mar. 29, 2022

(54) OPERATIONAL AMPLIFIER AND CHIP (71) Applicant: Huawei Technologies Co., Ltd., Shenzhen (CN)

(72) Inventor: Haixi Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/938,067

(22) Filed: Jul. 24, 2020

(65) Prior Publication Data
US 2020/0358414 A1 Nov. 12, 2020

Related U.S. Application Data (63) Continuation of application No. PCT/CN2019/070343, filed on Jan. 4, 2019.

(30) Foreign Application Priority Data

Jan. 26, 2018 (CN) .......................... 201810078364.X (51) Int. Cl.
*H03F 3/45* (2006.01)
*H03F 1/30* (2006.01)
*H03F 1/42* (2006.01)

(52) U.S. Cl.
CPC .......... *H03F 3/45748* (2013.01); *H03F 1/301* (2013.01); *H03F 1/42* (2013.01); *H03F 3/45636* (2013.01); *H03F 2200/447* (2013.01)

(58) Field of Classification Search
CPC ........ H03F 3/45748; H03F 1/301; H03F 1/42; H03F 3/45636; H03F 2200/447;

(Continued)

(56) References Cited

U.S. PATENT DOCUMENTS 7,893,766 B1 2/2011 Cranford, Jr. et al.
8,487,700 B2 * 7/2013 Hsu ..................... H03F 3/4565
330/258

(Continued)

FOREIGN PATENT DOCUMENTS

CN 1255937 C 5/2006
CN 101262206 A 9/2008

(Continued)

OTHER PUBLICATIONS

D'Amico, S., et al., "Active-Gm-RC Continuous-Time Biquadratic Cells," Analog Integrated Circuits and Signal Process I Ng, Kluwer Academic Pub Li Shers, BO, vol. 45, No. 3, Dec. 1, 2005, XP019204078, 14 pages.

(Continued)

*Primary Examiner* — Hieu P Nguyen
(74) *Attorney, Agent, or Firm* — Conley Rose, P.C.

(57) ABSTRACT

An operational amplifier includes a differential amplification circuit configured to receive and amplify an input voltage to generate an output voltage, and receive a feedback signal, and the feedback signal adjusts a common-mode voltage of the output voltage, a reference voltage generation circuit configured to detect status information of the operational amplifier, and generate a reference voltage based on the status information, where the status information includes a temperature or an operating voltage of the operational amplifier, and a common-mode feedback circuit configured to receive the output voltage and the reference voltage, and provide the feedback signal to the differential amplification circuit based on the output voltage and the reference voltage.

20 Claims, 7 Drawing Sheets (58) Field of Classification Search
CPC ....... H03F 3/45659; H03F 2203/45422; H03F 2203/45418; H03F 2203/45424; H03F 2203/45434; H03F 2203/45652; H03F 2200/528; H03F 2200/468; H03F 2200/408; H03F 3/45645; H03F 3/4565; H03F 2200/471; H03F 3/45475; H03F 3/45695; H03F 3/68
USPC .................................................. 330/252–261
See application file for complete search history.

(56) References Cited

U.S. PATENT DOCUMENTS

| | | |
|---|---|---|
| 9,257,941 B2 | 2/2016 | Fagg |
| 2008/0218266 A1 | 9/2008 | Kobayashi et al. |
| 2009/0295479 A1 | 12/2009 | Sunairi |
| 2012/0049960 A1 | 3/2012 | Hsu |
| 2013/0147548 A1 | 6/2013 | Ikeda |
| 2014/0300415 A1 | 10/2014 | Casiraghi et al. |

FOREIGN PATENT DOCUMENTS

| | | |
|---|---|---|
| CN | 101276228 A | 10/2008 |
| CN | 101592967 A | 12/2009 |
| CN | 101847973 A | 9/2010 |
| CN | 103872991 A | 6/2014 |

OTHER PUBLICATIONS

Centurelli, F., et al., "An improved common-mode feedback loop for the differential-difference amplifier," Analog Integrated Circuits and Signal Process I Ng, Kluwer Academic Pub Li Shers, BO, vol. 74, No. 1, Sep. 25, 2012, XP035154522, 16 pages.

Loeda, S., et al., "A 10/20/30/40 MHz Feedforward FIR DAC Continuous-Time ΔΣ ADC With Robust. Blocker Performance for Radio Receivers," IEEE Journal of Solid-State Circuits, vol. 51, No. 4, Apr. 2016, pp. 860-870.

Ho, S., et al., "A 23 mW, 73 dB Dynamic Range, 80 MHz BW Continuous-Time Delta-Sigma Modulator in 20 nm CMOS," IEEE Journal of Solid-State Circuits, vol. 50, No. 4, Apr. 2015, pp. 908-919.

Huang, S., A 125MHz-BW 71.9 dB SNDR VCO-Based CT Delta Sigma ADC with Segmented Phase Domain Compensation in 16 nm CMOS, ISSCC, 2017, pp. 470-471.

Wu, S., et al., "A 160 MHz BW 72dB-DR 40mW Continuous Time ΔΣ Modulator in 16 nm CMOS Analog ISI Reduction Technique," ISSCC, 2016, pp. 280-281.

Dong, Y., et al., "A Continuous-Time 0-3 MASH ADC Achieving 88 dB DR With 53 MHz BW in 28 nm CMOS," IEEE Journal of Solid-State Circuits, vol. 49, No. 12, Dec. 2014, pp. 2868-2877.

Caldwell, T., "A Reconfigurable ΔΣ ADC With Up to 100 MHz Bandwidth Using Flash Reference Shuffling," IEEE Transactions On Circuits and Systems-I: Regular Papers, vol. 61, No. 8, Aug. 2014, pp. 2263-2271.

* cited by examiner

Buffer

OPERATIONAL AMPLIFIER AND CHIP

CROSS-REFERENCE TO RELATED APPLICATIONS

This application is a continuation of International Patent Application No. PCT/CN2019/070343 filed on Jan. 4, 2019, which claims priority to Chinese Patent Application No. 201810078364.X filed on Jan. 26, 2018. The disclosures of the aforementioned applications are hereby incorporated by reference in their entireties.

TECHNICAL FIELD

This application relates to the field of electronic technologies, and in particular, to an operational amplifier and a chip.

BACKGROUND

An operational amplifier is the most fundamental module in an analog circuit. For example, the operational amplifier is an indispensable module in an integrator, a filter, an adder, and an analog-to-digital converter. In some extreme conditions, performance of a transistor is affected, and a speed of the operational amplifier is reduced or performance of the operational amplifier deteriorates. For example, as an operating temperature increases or decreases, a threshold voltage of the transistor varies inversely. This may cause an insufficient voltage margin of the transistor, and the transistor cannot maintain operating in a saturation region. Alternatively, a process variation or an unstable operating voltage may also cause an insufficient voltage margin of the transistor, and affects performance of the operational amplifier. With technology development and process evolution, a design requirement for the operational amplifier becomes increasingly high. It is expected in the industry that the operational amplifier can maintain good operating performance in some extreme conditions.

SUMMARY

This application provides an operational amplifier and a chip, to improve performance of the operational amplifier.

According to a first aspect, an operational amplifier is provided. The operational amplifier includes a differential amplification circuit, configured to receive and amplify an input voltage to generate an output voltage, where the differential amplification circuit is further configured to receive a feedback signal, and the feedback signal is used to adjust a common-mode voltage of the output voltage, a reference voltage generation circuit, configured to detect status information of the operational amplifier, and generate a reference voltage based on the status information, where the status information includes a temperature and/or an operating voltage of the operational amplifier, and a common-mode feedback circuit, configured to receive the output voltage and the reference voltage, and provide the feedback signal to the differential amplification circuit based on the output voltage and the reference voltage.

In this embodiment of this application, the reference voltage that varies with the temperature and/or the operating voltage is provided to the common-mode feedback circuit, so that the common-mode voltage of the output voltage of the operational amplifier can be adjusted based on the temperature and/or the operating voltage. Therefore, a voltage margin of a transistor in the operational amplifier can be flexibly adjusted in real time based on the temperature and/or the operating voltage, and operating performance of the operational amplifier is improved.

In a possible implementation, the reference voltage generation circuit includes a first bias circuit and a first metal-oxide-semiconductor (MOS) transistor, the first bias circuit is configured to provide a drain current to the first MOS transistor, and a gate of the first MOS transistor is short-circuited to a drain, and the reference voltage is a drain voltage of the first MOS transistor.

In a possible implementation, the reference voltage generation circuit includes a voltage divider circuit, the voltage divider circuit is located between the operating voltage and a ground, and the reference voltage is a voltage of a voltage divider node of the voltage divider circuit.

In a possible implementation, the reference voltage generation circuit includes a first bias circuit and a first MOS transistor, the first bias circuit is configured to provide a drain current to the first MOS transistor, and a gate of the first MOS transistor is short-circuited to a drain, and a first summation circuit, where an input terminal of the first summation circuit is configured to receive the drain voltage of the first MOS transistor and the operating voltage, and the reference voltage is a voltage at an output terminal of the first summation circuit.

In a possible implementation, a process of the first MOS transistor is the same as that of other MOS transistors in the operational amplifier.

In this embodiment of this application, because the process of the first MOS transistor is the same as that of the other MOS transistors in the operational amplifier, a process variation may also be reflected in the reference voltage. Therefore, the operational amplifier can adjust the voltage margin of the transistor in the operational amplifier based on the process, to improve operating performance of the operational amplifier.

In a possible implementation, the common-mode feedback circuit includes a second summation circuit, configured to receive the output voltage, and generate the common-mode voltage based on the output voltage, a first level switching circuit, configured to receive the common-mode voltage, and convert the common-mode voltage to obtain a first voltage, a second level switching circuit, configured to receive the reference voltage, and convert the reference voltage to obtain a second voltage, and an amplification circuit, including input pair transistors and an output terminal, where a gate of a second MOS transistor in the input pair transistors is configured to receive the first voltage, a gate of a third MOS transistor in the input pair transistors is configured to receive the second voltage, and the output terminal of the amplification circuit is configured to generate the feedback signal, where the first voltage output by the first level switching circuit enables the second MOS transistor to operate in a saturation region, and the second voltage output by the second level switching circuit enables the third MOS transistor to operate in the saturation region.

In this embodiment of this application, the first level switching circuit and the second level switching circuit are disposed in the common-mode feedback circuit, to perform level switching on the input voltage of the common-mode feedback circuit, to ensure operating performance of the amplification circuit in the common-mode feedback circuit, and improve operating performance of the operational amplifier.

In a possible implementation, the differential amplification circuit includes K stages of amplification circuit, a $(K-1)^{th}$ stage of amplification circuit includes a second bias circuit, and a gate of a fourth MOS transistor in the second bias circuit is configured to receive the feedback signal, where K≥2.

In a possible implementation, the common-mode feedback circuit further includes a filter circuit, the filter circuit is configured to receive the common-mode voltage and filter out a direct current component of the common-mode voltage, to obtain a fast path feedback signal, and the fast path feedback signal is an alternating current component of the common-mode voltage, and the differential amplification circuit includes the K stages of amplification circuit, a $K^{th}$ stage of amplification circuit includes a third bias circuit, and a gate of a fifth MOS transistor in the third bias circuit is configured to receive the fast path feedback signal, where K≥2.

In this embodiment of this application, to compensate for a phase margin of the common-mode feedback circuit, the common-mode voltage is directly coupled to the last stage of amplification circuit in the amplification circuit via a filter circuit, to form a one-stage amplification effect on the common-mode voltage. Because there is only one pole, the common-mode voltage attenuates relatively slowly at a high frequency, so that a phase margin compensation effect is formed, and performance of the operational amplifier when operating at a high frequency is improved.

According to a second aspect, a chip is provided, and the operational amplifier according to any one of the first aspect or the possible implementations of the first aspect is disposed on the chip.

DESCRIPTION OF EMBODIMENTS

The following describes technical solutions of this application with reference to the accompanying drawings.

Embodiments of this application provide an operational amplifier, to improve operating performance of the operational amplifier in a low-voltage operating state.

In the related art, the operational amplifier usually includes a common-mode feedback circuit, and the common-mode feedback circuit is configured to adjust a common-mode voltage of an output voltage of the operational amplifier. An input terminal of the common-mode feedback circuit is configured to receive the output voltage and a reference voltage of the operational amplifier, and output a feedback signal based on the output voltage and the reference voltage. The feedback signal is used to adjust the common-mode voltage of the output voltage. In the embodiments of this application, the common-mode voltage is a signal relative to a common ground, and a differential-mode voltage is a difference between two signals. In this application, the common-mode voltage of the input voltage may also be referred to as an input common-mode voltage. The common-mode voltage of the output voltage may also be referred to as an output common-mode voltage. In a conventional design, an input common-mode voltage and an output common-mode voltage of an operational amplifier are usually constant, and do not vary with a process, an operating voltage, and a temperature (PVT). The process refers to a difference that is between performance parameters of devices in different production batches, different wafers, or different positions in a same wafer and that is caused in a process of manufacturing a circuit due to an error in a manufacturing process, for example, an error of doping density. For example, a difference between threshold voltages of transistors is caused by a process error.

The embodiments of this application provide an operational amplifier. A common-mode voltage of an output voltage of the operational amplifier may vary in real time with a process, an operating voltage, and/or a temperature, so that a voltage margin of a transistor in a circuit can be flexibly adjusted and allocated in real time. Therefore, a problem of circuit performance deterioration caused by an insufficient voltage margin of the transistor in extreme conditions is resolved. The voltage margin may refer to a voltage constraint condition in which the transistor operates in a saturation region.

It should be noted that the operational amplifier in the embodiments of this application may be implemented by a MOS field-effect transistor (MOSFET). In this application, the MOSFET may also be referred to as a MOS transistor or a transistor. The MOS transistor includes two types, namely, an N-type MOS transistor and a P-type MOS transistor. The N-type MOS transistor and the P-type MOS transistor may be referred to as an NMOS transistor and a PMOS transistor, or an NMOS and a PMOS, respectively.

Figure 1:
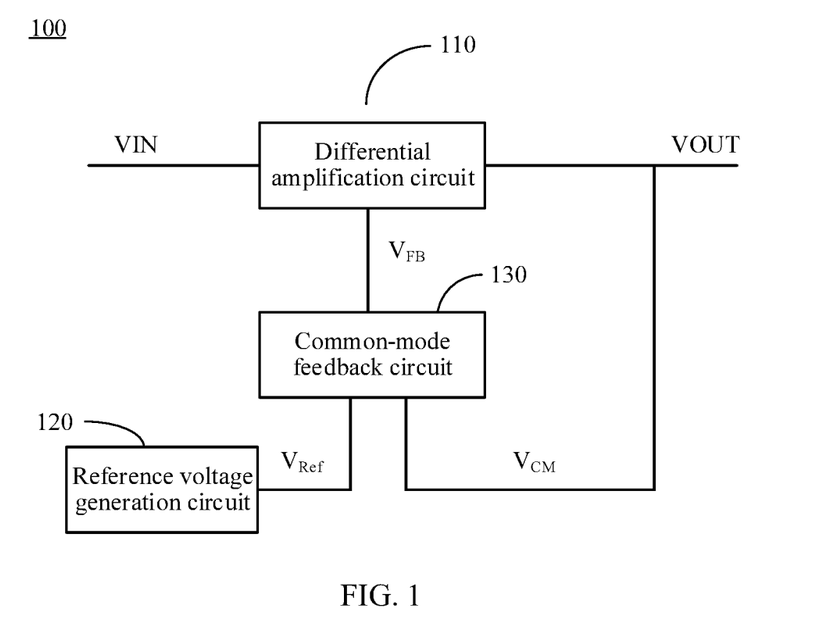
FIG. 1 is a schematic diagram of a framework of an operational amplifier according to an embodiment of this application.

FIG. 1 is a schematic structural diagram of an operational amplifier 100. As shown in FIG. 1, the operational amplifier 100 includes a differential amplification circuit 110, a reference voltage generation circuit 120, and a common-mode feedback circuit 130. A structure of each circuit in the operational amplifier 100 is described in detail below.

The differential amplification circuit 110 is configured to receive and amplify an input voltage VIN to generate an output voltage VOUT. The differential amplification circuit is further configured to receive a feedback signal $V_{FB}$, and the feedback signal $V_{FB}$ is used to adjust a common-mode voltage $V_{CM}$ of the output voltage.

The differential amplification circuit 110 may be of a fully differential structure. That is, both the input voltage VIN and the output voltage VOUT may be differential signals. The differential amplification circuit 110 may include a single stage of amplification circuit, or the differential amplification circuit 110 may include multiple stages of amplification circuits. When the differential amplification circuit includes the multiple stages of amplification circuits, an output voltage of a previous stage of amplification circuit is configured as an input voltage of a current stage of amplification circuit.

Figure 2:
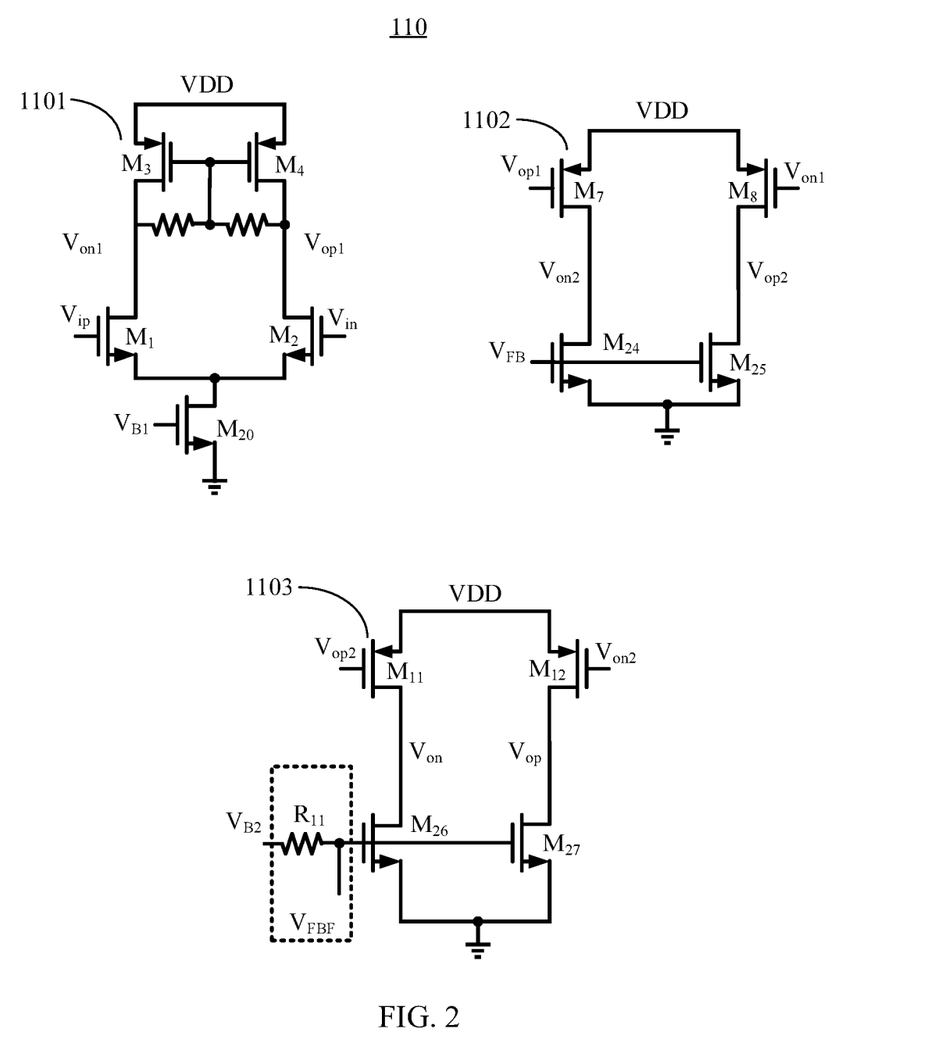
FIG. 2 is a schematic diagram of a differential amplification circuit according to an embodiment of this application.

In an example, FIG. 2 is a schematic circuit diagram of a differential amplification circuit 110 according to an embodiment of this application. The differential amplification circuit 110 includes three stages of amplification circuits, namely, a first-stage amplification circuit 1101, a second-stage amplification circuit 1102, and a third-stage amplification circuit 1103. $V_{in}$ and $V_{ip}$ represent input voltages of the first-stage amplification circuit 1101. $V_{on1}$ and $V_{op1}$ represent output voltages of the first-stage amplification circuit 1101, and $V_{on1}$ and $V_{op1}$ are also input voltages of the second-stage amplification circuit 1102. $V_{on2}$ and $V_{op2}$ represent output voltages of the second-stage amplification circuit 1102, and $V_{on2}$ and $V_{op2}$ are also input voltages of the third-level amplification circuit 1103. $V_{on}$ and $V_{op}$ represent output voltages of the third-stage amplification circuit 1103. The input voltages $V_{in}$ and $V_1$, of the first-stage amplification circuit 1101 are the input voltage VIN of the operational amplifier, and the output voltages $V_{on}$ and $V_{op}$ of the third-stage amplification circuit 1103 are the output voltage VOUT of the operational amplifier. $V_{B1}$ and $V_{B2}$ represent bias voltages of a bias circuit, and the bias circuit is configured to provide a bias current for input pair transistors. Generally, each stage of amplification circuit includes input pair transistors and a bias circuit. For example, input pair transistors of the first-stage amplification circuit 1101 are a transistor $M_1$ and a transistor $M_2$, and a bias circuit includes a transistor $M_{20}$. Input pair transistors of the second-stage amplification circuit 1102 are a transistor $M_7$ and a transistor $M_8$, and a bias circuit includes a transistor $M_{24}$ and a transistor $M_{25}$. Input pair transistors of the third-stage amplification circuit 1103 are a transistor $M_{11}$ and a transistor $M_{12}$, and a bias circuit includes a transistor $M_{26}$ and a transistor $M_{27}$.

Figure 3:
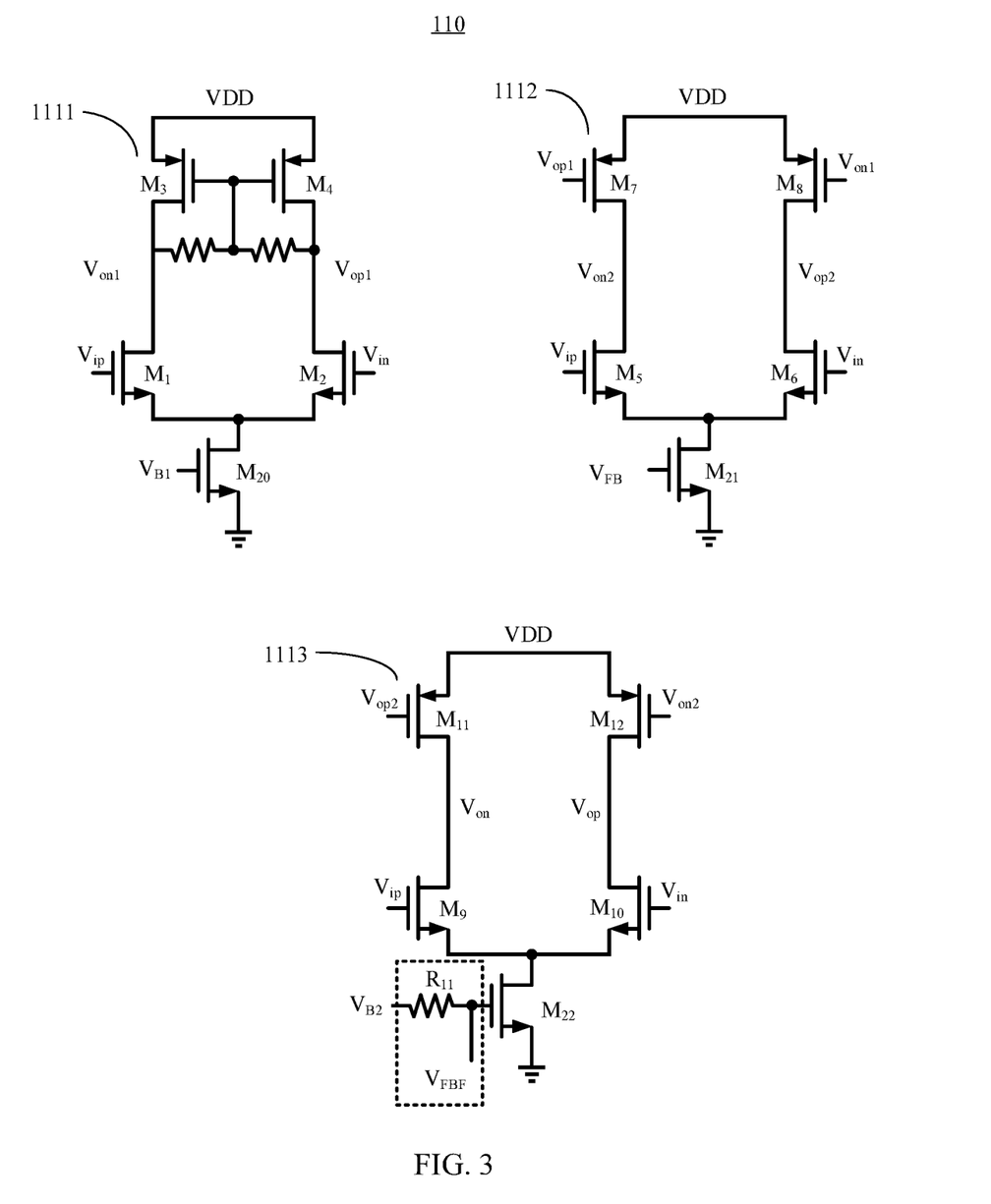
FIG. 3 is a schematic diagram of a differential amplification circuit according to another embodiment of this application.

In another example, FIG. 3 is a schematic circuit diagram of a differential amplification circuit 110 according to another embodiment of this application. The differential amplification circuit 110 in FIG. 3 is a three-stage feedforward amplification circuit. "Feedforward" means that each stage of amplification circuit directly receives the input voltage of the operational amplifier and receives an output voltage of a previous-stage amplification circuit. By adding the feedforward circuit, there are three paths from the input voltage to the output voltage. A first path is a three-stage amplification path, and an input signal sequentially passes through three amplification circuits to form a three-stage amplification effect. A feature of the three-stage amplification effect is that a low-frequency gain is high, and gain attenuation is relatively fast at a high frequency because there are three poles. A second path is a two-stage amplification path. The input voltage is directly coupled to a second-stage amplifier through a first feedforward and output, and then forms a two-stage amplification effect together with a third-stage amplifier. A feature of the two-stage amplification effect is that a gain is relatively high at a medium frequency, and attenuation is relatively fast at a high frequency because there are two poles. A third path is a one-stage amplification path. The input voltage is directly coupled to the output voltage through a second feedforward amplification circuit to form a one-stage amplification effect. Gain attenuation is relatively slow at a high frequency because there is only one pole. Through the feedforward amplification circuit, a new zero can be generated to offset the poles inside the three-stage amplification circuit, thereby improving a phase margin of the differential amplification circuit. As shown in FIG. 3, the differential amplification circuit 110 includes a first-stage amplification circuit 1111, a second-stage amplification circuit 1112, and a third-stage amplification circuit 1113. A circuit structure of the first-stage amplification circuit 1111 is the same as or similar to the circuit structure of the first-stage amplification circuit 1101 in FIG. 2. The second-stage amplification circuit 1112 may include two pairs of input pair transistors and a bias circuit. A first pair of input pair transistors are a transistor $M_7$ and a transistor $M_8$, and are configured to receive output voltages $V_{on1}$ and $V_{op1}$ of the first-stage amplification circuit 1111. A second pair of input pair transistors are a transistor $M_5$ and a transistor $M_6$, and are configured to receive input voltages $V_{in}$ and $V_{ip}$ of the operational amplifier. The bias circuit includes a transistor $M_{21}$. The third-stage amplification circuit may also include two pairs of input pair transistors. A first pair of input pair transistors are a transistor $M_{11}$ and a transistor $M_{12}$, and are configured to receive output voltages $V_{on2}$ and $V_{op2}$ of the second-stage amplification circuit 1112. A second pair of input pair transistors are a transistor $M_9$ and a transistor $M_{10}$, and are configured to receive input voltages $V_{in}$ and $V_{ip}$ of the operational amplifier. The bias circuit includes a transistor $M_{22}$. The differential amplification circuit 110 in each of FIG. 2 and FIG. 3 is merely an example. The differential amplification circuit may further include other types of variations, optimizations, or configurations, which are not listed one by one in this application.

The reference voltage generation circuit 120 is configured to detect status information of the operational amplifier 100, and generate a reference voltage $V_{Ref}$ based on the status information, and the status information includes a temperature and/or an operating voltage $V_{DD}$ of the operational amplifier 100.

The foregoing reference voltage $V_{Ref}$ is generated based on status information. That is, the reference voltage $V_{Ref}$ may vary in real time depending on the temperature and/or the operating voltage $V_{DD}$ of the operational amplifier. The operating voltage $V_{DD}$ is also a source voltage.

Figure 4:
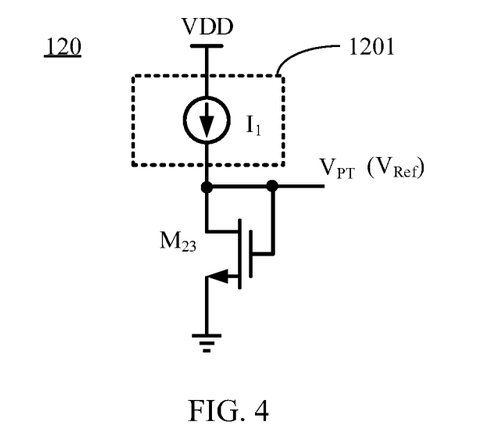
FIG. 4 is a schematic diagram of a reference voltage generation circuit according to an embodiment of this application.

The foregoing reference voltage generation circuit 120 has a plurality of implementations. In an example, FIG. 4 is a schematic circuit diagram of a reference voltage generation circuit 120 according to an embodiment of this application. A reference voltage $V_{Ref}$ in FIG. 4 may reflect a temperature variation. As shown in FIG. 4, the reference voltage generation circuit 120 includes a first bias circuit 1201 and a first MOS transistor $M_{23}$. The first bias circuit 1201 is configured to provide a drain current to the first MOS transistor $M_{23}$, a gate of the first MOS transistor $M_{23}$ is short-circuited to a drain, and the reference voltage $V_{Ref}$ is a drain voltage $V_{PT}$ of the first MOS transistor $M_{23}$. The foregoing first bias circuit 1201 may be, for example, a current source. The current source is configured to provide a constant current $I_1$. The foregoing first MOS transistor $M_{23}$ may be configured to detect a temperature of the circuit, and the temperature variation can be reflected in the drain voltage $V_{PT}$ of $M_{23}$. In addition, it should be noted that, because the first MOS transistor $M_{23}$ and other MOS transistors in an operational amplifier are usually located in a same chip, a process of the first MOS transistor $M_{23}$ and a process of the other MOS transistors in the operational amplifier may be considered to be the same. Therefore, a process variation can also be reflected in the drain voltage $V_{PT}$ of the first MOS transistor $M_{23}$. That is, $V_{PT}$ in FIG. 4 can reflect both the temperature variation and the process variation.

Further, the drain voltage $V_{PT}$ of the first MOS transistor $M_{23}$ may be expressed by using the following formula:

$$V_{PT} = \sqrt{\frac{2I_1}{\mu C_{ox} \left(\frac{W}{L}\right)_{23}}} + V_{th}. \quad (1)$$

Parameters in formula (1) are shown as follows. It can be learned from the following descriptions of the parameters that $V_{PT}$ can reflect the temperature variation and the process variation.

μ represents electron mobility or hole mobility of the transistor, and is in $1/T^2$ relationship with the temperature. That is, the higher the temperature, the lower μ, and the higher $V_{PT}$, or the lower the temperature, the higher μ, and the lower $V_{PT}$.

$C_{ox}$ represents a unit gate oxide parasitic capacitance of a transistor, and is equal to a dielectric constant of an oxidized layer divided by a thickness of the oxidized layer. Both the dielectric constant of the oxidized layer and the thickness of the oxidized layer are affected by the process. For example, generally, the faster the process (FF), the larger $C_{ox}$, and the lower $V_{PT}$, or the slower the process (FF), the smaller $C_{ox}$, and the higher $V_{PT}$. Fast or slow process means that a conduction speed of the MOS transistor increases or decreases due to a difference in the process. For example, FF represents that conduction speeds of an NMOS and a PMOS are both high, SS represents that the conduction speeds of the NMOS and the PMOS are both low, FS represents that the conduction speed of the NMOS is high and the conduction speed of the PMOS is low, and SF represents that the conduction speed of the NMOS is low and the conduction speed of the PMOS is high.

$\left(\frac{W}{L}\right)_{23}$ represents a width-to-length ratio of the transistor $M_{23}$.

$I_1$ represents the drain current of the transistor $M_{23}$.

$V_{th}$ represents a threshold voltage of the transistor $M_{23}$, and is affected by both the temperature and the process. Generally, the higher the temperature, the lower $V_{th}$, or the lower the temperature, the higher $V_{th}$. The faster the process, the lower $V_{th}$, or the slower the process, the higher $V_{th}$.

Figure 5:
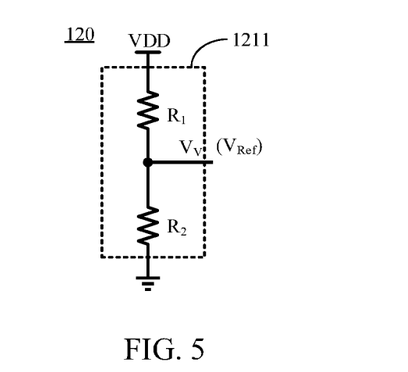
FIG. 5 is a schematic diagram of a reference voltage generation circuit according to another embodiment of this application.

In another example, FIG. 5 is a schematic circuit diagram of a reference voltage generation circuit 120 according to another embodiment of this application. A reference voltage $V_{Ref}$ in FIG. 5 may reflect a variation in an operating voltage $V_{DD}$. As shown in FIG. 5, the reference voltage generation circuit 120 may include a voltage divider circuit 1211. The voltage divider circuit 1211 is located between the operating voltage $V_{DD}$ and a ground, and the reference voltage $V_{Ref}$ is a voltage $V_v$ of a voltage divider node of the voltage divider circuit. The voltage divider circuit 1211 may be a series circuit including a resistor $R_1$ and a resistor $R_2$.

Figure 6:
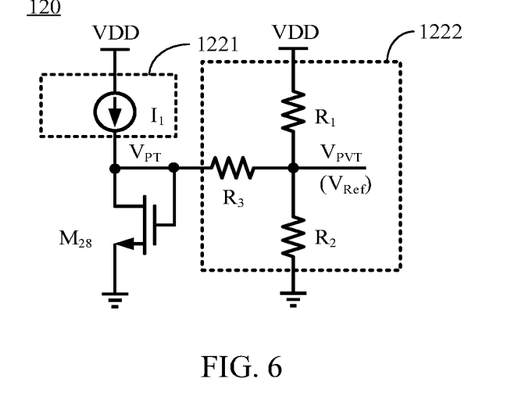
FIG. 6 is a schematic diagram of a reference voltage generation circuit according to still another embodiment of this application.

In still another example, FIG. 6 is a schematic circuit diagram of a reference voltage generation circuit 120 according to still another embodiment of this application. A reference voltage $V_{Ref}$ in FIG. 6 may reflect a temperature variation and an operating voltage variation. Further, the reference voltage $V_{Ref}$ may also reflect a process variation. As shown in FIG. 6, the reference voltage generating circuit 120 includes a first bias circuit 1221 and a first MOS transistor $M_{28}$, where the first bias circuit is configured to provide a drain current to the first MOS transistor $M_{28}$, and a gate of the first MOS transistor $M_{28}$ is short-circuited to a drain, and a first summation circuit 1222, where an input terminal of the first summation circuit 1222 is configured to receive a drain voltage $V_{PT}$ and the operating voltage $V_{DD}$ of the first MOS transistor $M_{28}$, and the reference voltage $V_{Ref}$ is a voltage $V_{PVT}$ of an output terminal of the first summation circuit 1222. The first summation circuit 1222 may be a proportional summation circuit. To be specific, the reference voltage $V_{Ref}$ may be expressed as $V_{Ref}=a \times V_{PT} + b \times V_{DD}$, where a and b represent constants. $V_{PT}$ represents the drain voltage of the first MOS transistor $M_{28}$. For a calculation manner of $V_{PT}$, refer to formula (1). $V_{DD}$ represents the operating voltage. In an example, the first summation circuit 1222 in FIG. 6 may include a resistor $R_1$, a resistor $R_2$, and a resistor $R_3$. One terminal of each of $R_1$, $R_2$, and $R_3$ is connected to an output terminal of the first summation circuit 1222, and the other terminal of $R_1$, the other terminal of $R_2$, and the other terminal of $R_3$ are configured to connect to the operating voltage $V_{DD}$, the drain voltage $V_{PT}$ of the first MOS transistor $M_{28}$, and the ground, respectively. It can be deduced that the output voltage $V_{PVT}$ of the first summation circuit 1222 may be expressed as:

$$V_{PVT} = \frac{R_1 \| R_2 \| R_3}{R_3} V_{PT} + \frac{R_1 \| R_2 \| R_3}{R_1} V_{DD}. \quad (2)$$

To prevent the resistor $R_3$ from shunting the drain current provided by the first bias circuit to the first MOS transistor $M_{28}$, a resistance value of $R_3$ may be set to be far greater than an equivalent resistance $1/g_{m28}$ of the first MOS transistor $M_{28}$, and $g_{m28}$ represents a transconductance of the first MOS transistor $M_{28}$. Alternatively, a buffer may be disposed between the drain of the first MOS transistor $M_{28}$ and the resistor $R_3$, to avoid shunting of $R_3$. The buffer may include an amplifier.

Figure 7:
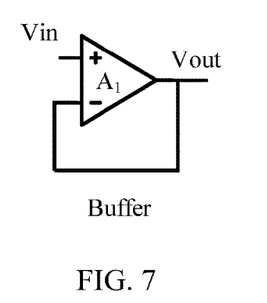
FIG. 7 is a schematic diagram of a buffer according to an embodiment of this application.

Optionally, to enhance a driving capability of the reference voltage $V_{Ref}$, a buffer may be added to the output terminal of the circuit in each of FIG. 4 to FIG. 6. The buffer may include an amplifier. For example, FIG. 7 is a schematic circuit diagram of a buffer according to an embodiment of this application. The buffer includes an amplifier $A_1$.

Optionally, a first summation circuit 1222 may be implemented in another manner, provided that a function of the first summation circuit 1222 is to implement proportional summation of $V_{PT}$ and $V_{DD}$. Details are not described herein one by one.

The common-mode feedback circuit 130 is configured to receive the output voltage VOUT and the reference voltage $V_{Ref}$, and provide the feedback signal $V_{FB}$ to the differential amplification circuit 110 based on the output voltage VOUT and the reference voltage $V_{Ref}$.

Figure 8:
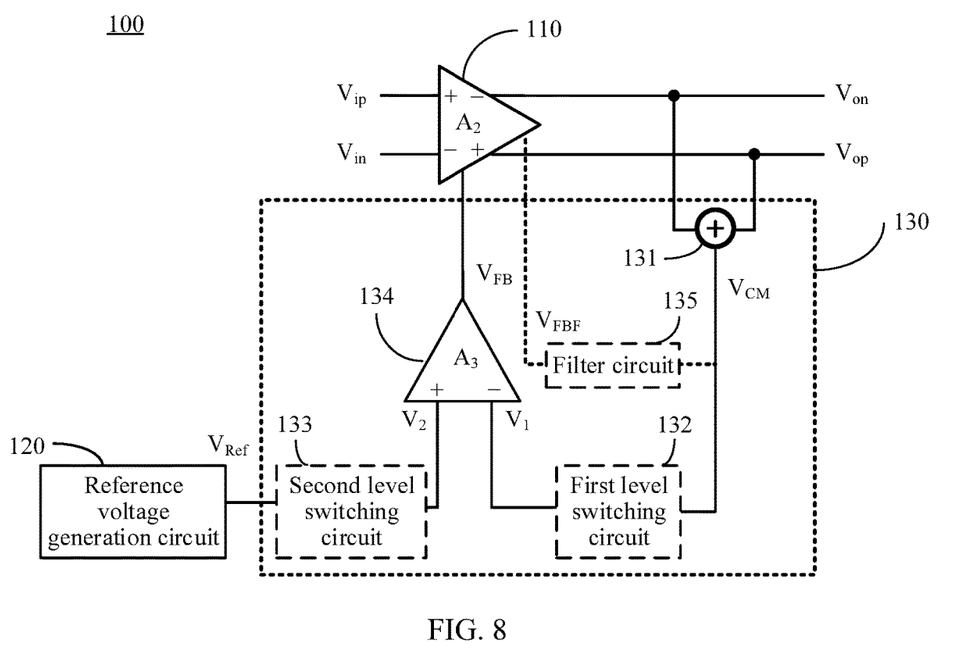
FIG. 8 is a schematic diagram of an operational amplifier according to another embodiment of this application.

In an example, FIG. 8 is a schematic circuit diagram of an operational amplifier 100 according to another embodiment of this application. As shown in FIG. 8, the foregoing common-mode feedback circuit 130 includes a second summation circuit 131, a first level switching circuit 132, a second level switching circuit 133, and an amplification circuit 134.

The second summation circuit 131 is configured to receive the output voltage VOUT, and generate the common-mode voltage $V_{CM}$ based on the output voltage VOUT. The input voltage VIN may include differential input voltages $V_{in}$ and $V_{ip}$, the output voltage VOUT may include differential output voltages $V_{on}$ and $V_{op}$, and the second summation circuit 131 may also be a proportional summation circuit. The second summation circuit 131 may be configured to generate a common-mode voltage $V_{CM}$ of the output voltages $V_{on}$ and $V_{op}$. $V_{CM}$ meets the following condition $V_{CM}=(V_{on}+V_{op})/2$.

The first level switching circuit 132 is configured to receive the common-mode voltage $V_{CM}$, and convert the common-mode voltage $V_{CM}$ to obtain a first voltage $V_1$. The second level switching circuit 133 is configured to receive the reference voltage $V_{Ref}$, and convert the reference voltage $V_{Ref}$ to obtain a second voltage $V_2$. The first level switching circuit 132 and the second level switching circuit 133 may be composed by passive resistors. A passive device can reduce power consumption of the level switching circuit, improve linearity, and speed up an operation.

In extreme conditions, for example, when a temperature is extremely high or extremely low, or a process deviates greatly from normal, performance of a MOS transistor is affected, and the MOS transistor may not operate in a saturation region. Therefore, performance deterioration of the circuit is caused. That the MOS transistor operates in the saturation region means that when the MOS transistor is operating, a gate-source voltage and a drain-source voltage of the MOS transistor meet the following condition:

$$V_{DS} \geq V_{GS} - V_{th}. \quad (3)$$

$V_{DS}$ represents a voltage between a drain and a source of the MOS transistor, $V_{GS}$ represents a voltage between a gate and the drain of the MOS transistor, and $V_{th}$ represents a threshold voltage of the MOS transistor. Functions of the foregoing first level switching circuit 132 and the foregoing second level switching circuit 133 are to perform level switching on an input voltage of the amplification circuit 134, that is, adjust gate-source voltages $V_{GS}$ of input pair transistors to ensure that the input pair transistors of the amplification circuit 134 operate in the saturation region. Therefore, the operational amplifier can operate properly in extreme conditions.

The amplification circuit 134 includes input pair transistors and an output terminal, where a gate of a second MOS transistor in the input pair transistors is configured to receive the first voltage $V_1$, a gate of a third MOS transistor in the input pair transistors is configured to receive the second voltage $V_2$, and the output terminal of the amplification circuit is configured to generate the feedback signal $V_{FB}$. The first voltage $V_1$ output by the first level switching circuit 132 enables the second MOS transistor to operate in the saturation region, and the second voltage $V_2$ output by the second level switching circuit 133 enables the third MOS transistor to operate in the saturation region.

In some examples, alternatively, the common-mode feedback circuit 130 may not include the first level switching circuit 132 and the second level switching circuit 133. In this case, an input terminal of the amplification circuit 134 may be configured to receive the common-mode voltage $V_{CM}$ and the reference voltage $V_{Ref}$.

Figure 9:
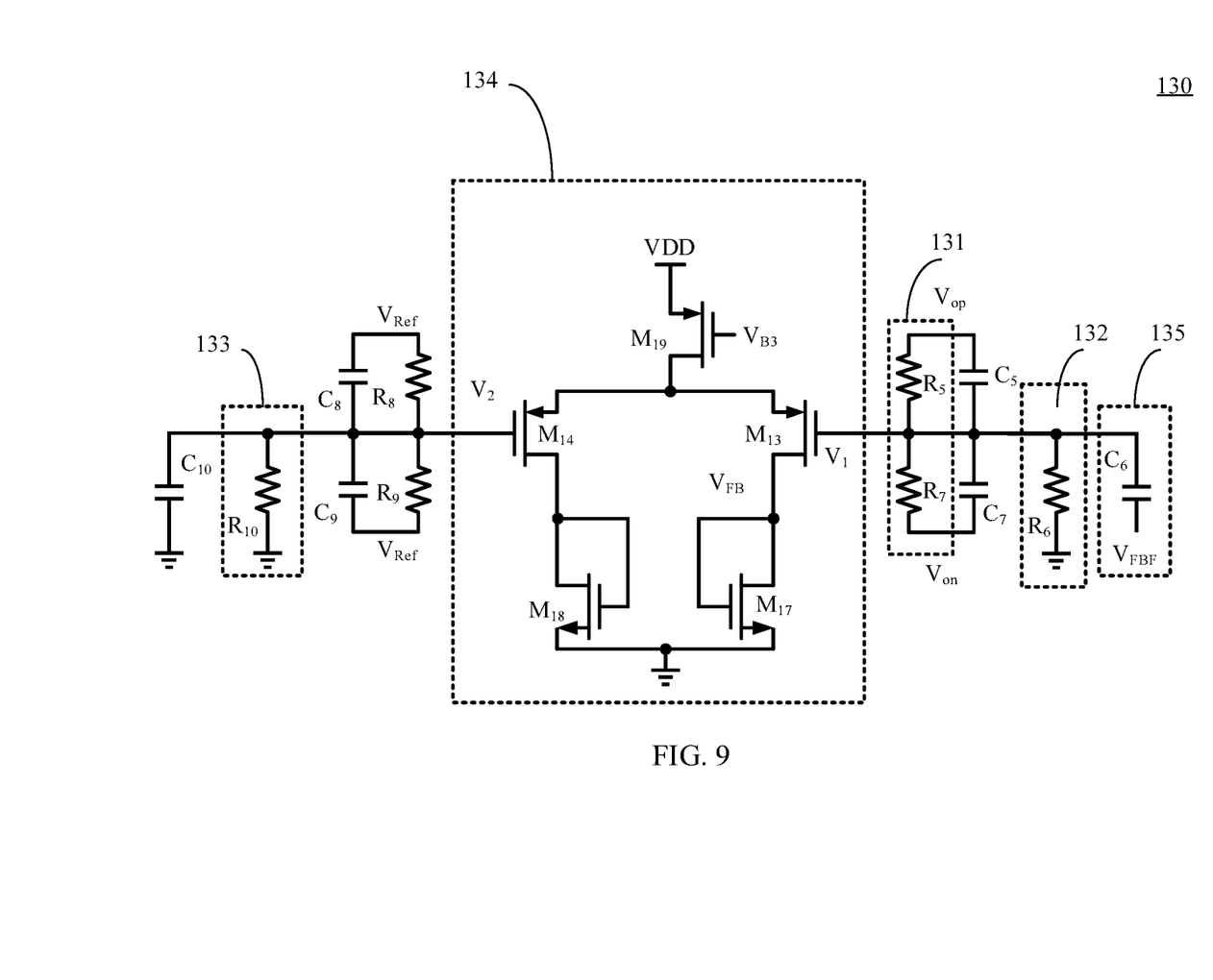
FIG. 9 is a schematic diagram of a common-mode feedback circuit according to an embodiment of this application.

In an example, FIG. 9 is a schematic circuit diagram of a common-mode feedback circuit 130 according to another embodiment of this application. As shown in FIG. 9, the common-mode feedback circuit 130 includes a second summation circuit 131, a first level switching circuit 132, a second level switching circuit 133, and an amplification circuit 134. The second summation circuit 131 includes resistors $R_5$ and $R_7$. The first level switching circuit 132 includes a pull-down resistor $R_6$. The second level switching circuit 133 includes a pull-down resistor $R_{10}$. During level switching, if $V_{CM}$ or $V_{REF}$ needs to be decreased, a pull-down resistor may be used in the level switching circuit, that is, one terminal of the resistor is grounded. If $V_{CM}$ or $V_{REF}$ needs to be increased, a pull-up resistor may be used in the level switching circuit, that is, one terminal of the resistor is connected to the operating voltage. The amplification circuit 134 may be a single-stage or multi-stage amplification circuit. An input terminal of the amplification circuit 134 is configured to receive $V_1$ and $V_2$, and an output terminal of the amplification circuit 134 is configured to output a feedback signal $V_{FB}$. A second MOS transistor in input pair transistors in the foregoing amplification circuit 134 is equivalent to a transistor $M_{13}$ in the amplification circuit 134, and a third MOS transistor in the input pair transistors in the foregoing amplification circuit 134 is equivalent to a transistor $M_{14}$ in the amplification circuit 134. $V_{B3}$ is a bias voltage.

Still referring to FIG. 8, the feedback signal $V_{FB}$ generated by the common-mode feedback circuit 130 is fed back to the differential amplification circuit 110, to adjust the common-mode voltage $V_{CM}$ of an output voltage of the differential amplification circuit 110. For example, the feedback signal $V_{FB}$ may be sent to a gate of a transistor of a bias circuit of a stage of amplification circuit in the differential amplification circuit 110. In some examples, design factors such as a unit gain bandwidth and a phase margin of an operational amplifier are comprehensively considered. It is assumed that the differential amplification circuit includes K stages of amplification circuits. A $(K-1)^{th}$ stage of amplification circuit includes a second bias circuit, and a gate of a fourth MOS transistor in the second bias circuit is configured to receive the feedback signal $V_{FB}$, where K≥2. For example, referring to FIG. 2, for the three stages of amplification circuits, the feedback signal $V_{FB}$ is sent to gates of the transistors $M_{24}$ and $M_{25}$ in the bias circuit of the second-stage amplification circuit 1102. That is, the foregoing fourth MOS transistor is equivalent to the transistors $M_{24}$ and $M_{25}$. Alternatively, referring to FIG. 3, the feedback signal $V_{FB}$ is sent to a gate of the transistor $M_{21}$ in the bias circuit of the second-stage amplification circuit 1112. That is, the foregoing fourth MOS transistor in the second bias circuit is equivalent to the transistor $M_{21}$.

Optionally, the common-mode feedback circuit 130 may alternatively include a filter circuit 135. The filter circuit 135 is configured to receive the common-mode voltage $V_{CM}$, and filter out a direct current component of the common-mode voltage $V_{CM}$, to obtain a fast path feedback signal $V_{FBF}$. The fast path feedback signal $V_{FBF}$ is an alternating current component of the common-mode voltage. It is assumed that the differential amplification circuit 110 includes the K stages of amplification circuits, where K≥2, and a $K^{th}$ stage of amplification circuit includes a third bias circuit. A gate of a fifth MOS transistor in the third bias circuit is configured to receive the fast path feedback signal $V_{FBF}$, where K≥2. For example, referring to FIG. 2, for the three stages of amplification circuits, the fast path feedback signal $V_{FBF}$ is sent to gates of the transistors $M_{26}$ and $M_{27}$ in the bias circuit of the third-stage amplification circuit 1103. That is, the foregoing fifth MOS transistor is equivalent to the transistors $M_{26}$ and $M_{27}$. Alternatively, referring to FIG. 3, the fast path feedback signal $V_{FBF}$ is sent to a gate of the transistor $M_{22}$ in the bias circuit of the third-stage amplification circuit 1113. That is, the foregoing fifth MOS transistor in the third bias circuit is equivalent to the transistor $M_{23}$.

The filter circuit 135 may include any circuit module that can implement the foregoing functions. For example, FIG. 9 further shows the filter circuit 135. The filter circuit 135 may include a capacitor $C_6$. One terminal of $C_6$ is configured to receive the common-mode voltage $V_{CM}$, and the other terminal of $C_6$ is configured to output the fast path feedback signal $V_{FBF}$.

Similar to the principle of the three-stage feedforward circuit described above, the filter circuit 135 herein also introduces a feedforward circuit, to compensate for the phase margin of the common-mode feedback circuit. The operating principle is as follows. The common-mode voltage is directly coupled to the last stage of amplification circuit through the feedforward circuit, to form a one-stage amplification effect on the common-mode voltage. Because there is only one pole, the common-mode voltage attenuates slowly at a high frequency, thereby forming a phase margin compensation effect. Optionally, still referring to FIG. 2 and FIG. 3, a resistor $R_{11}$ may be disposed in the third bias circuit. One terminal of the resistor $R_{11}$ is configured to connect to the bias voltage $V_{B2}$, and the other terminal is configured to connect to the gate of the fifth MOS transistor. In a case of a low frequency, because the capacitor has a characteristic of blocking a direct current and allowing an alternating current to pass, the filter circuit 135 does not operate, and the bias voltage $V_{B2}$ is transmitted to the gate of the fifth MOS transistor via the resistor $R_{11}$. As the frequency increases, the filter circuit 135 starts to operate, and impedance of $R_{11}$ increases relative to the filter circuit 135, so that the gate of the fifth MOS transistor starts to be affected by both $V_{B2}$ and the filter circuit 135. When the frequency is sufficiently high, the impedance of $R_{11}$ is far less than that of the filter circuit 135. In this case, the gate voltage of the fifth MOS transistor is mainly affected by the filter circuit 135. That is, the gate voltage of the fifth MOS transistor is mainly affected by the fast path feedback signal $V_{FBF}$.

Optionally, the common-mode feedback circuit 130 described above is merely an example. Various variations or optimizations may be further performed based on the foregoing circuit. For example, as shown in FIG. 9, after the second summation circuit 131 is configured, because the gate of the input transistor $M_{13}$ has a parasitic capacitor, there is a pole at the gate of the $M_{13}$ when the input transistor $M_{13}$ operates at a high frequency. Capacitors $C_5$ and $C_6$ may be disposed between the gate of the input transistor $M_{13}$ and the output voltages $V_{op}$ and $V_{on}$ in the amplification circuit 134 to offset the pole, thereby optimizing the performance of the circuit.

Optionally, to achieve circuit matching, the circuit of the input terminal of the amplification circuit 134 can be symmetrically distributed. For example, to ensure symmetry, in the common-mode feedback amplification circuit in FIG. 9, the input pair transistors $M_{13}$ and $M_{14}$ use a symmetric structure design, and the resistors and capacitors may use the following configuration $R_5=R_7=R_8=R_9$, $C_5=C_7=C_8=C_9$, $R_6=R_{10}$, and $C_6=C_{10}$.

In this embodiment of this application, the reference voltage that varies with the temperature and/or the operating voltage is provided to the common-mode feedback circuit, so that the common-mode voltage of the output voltage can be adjusted based on the temperature and/or the operating voltage. Therefore, a voltage margin of a transistor in the operational amplifier can be flexibly adjusted in real time based on the temperature and/or the operating voltage, and operating performance of the operational amplifier is improved.

Further, in this embodiment of this application, because the process of the first MOS transistor is the same as that of the other MOS transistors in the operational amplifier, a process variation may also be reflected in the reference voltage. Therefore, the operational amplifier can also adjust the voltage margin of the transistor in the operational amplifier based on the process, to improve operating performance of the operational amplifier.

It should be noted that the operational amplifier is usually applied to a scenario in which a plurality of operational amplifiers are connected in series, to implement a multi-stage filtering effect. An output of a previous operational amplifier is usually used as an input of a current operational amplifier. Therefore, an output common-mode voltage of the previous operational amplifier is usually an input common-mode voltage of the current operational amplifier. This scenario is common in a filter or Delta-Sigma analog-to-digital converter (ADC) design.

It can be learned from the foregoing descriptions of formula (1) that the slower the process, the lower the temperature, and the higher the threshold voltage. For example, Table 1 shows an example of a correspondence between an operating state of the operational amplifier and the threshold voltage of the transistor. With reference to FIG. 3 and Table 1, the following describes a principle of adjusting the output common-mode voltage $V_{CM}$ based on the status information.

TABLE 1

| Operating status | Threshold voltage $V_{th}$ |
| --- | --- |
| TT (normal process) 25 Celsius (° C.) | 0.38 volts (V) |
| SS (slow process) −40° C. | 0.45 V |

Referring to FIG. 3, it is assumed that two operational amplifiers in FIG. 3 are connected in series. In this case, a common-mode voltage $V_{CM}$ of output voltages $V_{op}$ and $V_{on}$ of a previous operational amplifier is a common-mode voltage of input voltages $V_{in}$ and $V_1$, of a current operational amplifier. For example, assuming that $V_{Ref}$ is set to 0.55 V, due to a common-mode feedback effect, the output common-mode voltage of the previous operational amplifier is also 0.55 V, and the input common-mode voltage of the current operational amplifier is also 0.55 V. Herein, it is assumed that overdrive voltages of transistors $M_1$ and $M_2$, $M_5$ and $M_6$, and $M_9$ and $M_{10}$ in the operational amplifier are equal to 70 mV. The overdrive voltage is a residual voltage by which a gate-source voltage exceeds a threshold voltage of the transistor, that is, $V_{GS}-V_{th}$.

When an operating process of the operational amplifier is the normal process (TT) and the operational amplifier operates at 25° C., the threshold voltages $V_{th}$ of the input pair transistors $M_1$ and $M_2$, $M_5$ and $M_6$, and $M_8$ and $M_{10}$ are equal to 0.38 V according to Table 1. The input common-mode voltage of the current operational amplifier is 0.55 V. After the threshold voltages $V_{th}$ and the overdrive voltage are subtracted (that is, $V_{GS}-V_{th}$), drain-source voltages $Y_{DS}$ reserved for $M_{20}$, $M_{21}$, and $M_{22}$ are 100 millivolts (mV). $M_{20}$, $M_{21}$, and $M_{22}$ can operate in a saturation region, and in this case, the current operational amplifier can operate properly.

When the operational amplifier operates in the slow process (SS) and the operating temperature is −40° C., the threshold voltages $V_{th}$ of the input pair transistors $M_1$ and $M_2$, $M_5$ and $M_6$, and $M_9$ and $M_{10}$ are up to 0.45 V according to Table 1. If the reference voltage $V_{Ref}$ remains 0.55 V, the input common-mode voltage of the current operational amplifier also remains 0.55 V. After the threshold voltages $V_{th}$ 0.45 V and the overdrive voltages 70 mV of $M_1$ and $M_2$, $M_5$ and $M_6$, and $M_9$ and $M_{10}$ are subtracted from the input common-mode voltage, the overdrive voltages reserved for $M_{20}$, $M_{21}$, and $M_{22}$ are only 30 mV. $M_{20}$, $M_{21}$, and $M_{22}$ enter a linear region, and the current operational amplifier cannot operate properly. If the reference voltage generation circuit in FIG. 4 is used, the reference voltage $V_{Ref}$ varies with a temperature and a process. According to formula (1), when the operational amplifier is in the slow process (SS) and operates at −40° C., $V_{Ref}$ also increases by 70 mV. In this way, the output common-mode voltage of the previous operational amplifier increases from 0.55 V to 0.62 V, the input common-mode voltage of the current operational amplifier also increases to 0.62 V, and after the threshold voltages $V_{th}$ and the overdrive voltages of $M_1$ and $M_2$, $M_5$ and $M_6$, and $M_9$ and $M_{10}$ are subtracted from the input common-mode voltage, the overdrive voltages reserved for $M_{20}$, $M_{21}$, $M_{22}$ are still 100 mV. $M_{20}$, $M_{21}$, and $M_{22}$ operate in the saturation region, and the operational amplifier can still operate properly.

Similarly, if the operational amplifier operates in extreme conditions in which a process is fast, a temperature is high, or an operating voltage fluctuates, the operational amplifier may also perform corresponding adjustment based on the temperature, the process, or the operating voltage, so that the transistor can maintain operating in the saturation region, thereby improving operating performance of the operational amplifier and the circuit in the extreme conditions.

The operational amplifier 100 provided in this embodiment of this application may be applied to various operating environments. For example, the operational amplifier 100 may be applied to a low-voltage operating scenario. With process evolution and a requirement for low power consumption, an operating voltage provided for a circuit is increasingly low. However, for an analog circuit, if the operating voltage is decreased, the voltage margin for maintaining the transistor to operate in the saturation region is increasingly small. The output common-mode voltage of the operational amplifier in this application may be adjusted based on the temperature and/or the operating voltage. Therefore, the voltage margin of the transistor in the operational amplifier may be flexibly adjusted in real time based on the temperature and/or the operating voltage, and operating performance of the operational amplifier is improved when the operational amplifier operates at a low voltage.

The operational amplifier provided in this embodiment of this application may be applied to a plurality of types of circuits. For example, in a Delta-Sigma ADC, or in a circuit such as an integrator or a filter.

Figure 10:
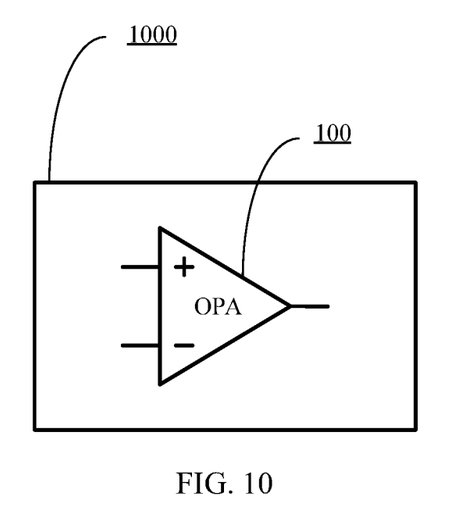
FIG. 10 is a schematic diagram of a chip according to an embodiment of this application.

In addition, an embodiment of this application further provides a chip 1000. FIG. 10 is a schematic diagram of the chip 1000 according to an embodiment of this application. As shown in FIG. 10, the foregoing operational amplifier 100 is disposed on the chip.

The foregoing descriptions are merely specific implementations of this application, but are not intended to limit the protection scope of this application. Variations or replacements readily figured out by a person skilled in the art within the technical scope disclosed in this application shall fall within the protection scope of this application. Therefore, the protection scope of this application shall be subject to the protection scope of the claims.

In the several embodiments provided in this application, it should be understood that the disclosed system, apparatus, and method may be implemented in other manners. For example, the described apparatus embodiments are merely examples. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces, indirect couplings or communication connections between the apparatuses or units, or electrical connections, mechanical connections, or connections in other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments in this application.

In addition, functional units in the embodiments of this application may be integrated into one processing unit, or each of the units may exist alone physically, or two or more units are integrated into one unit. The integrated unit may be implemented in a form of hardware, or may be implemented in a form of a software functional unit.

The foregoing descriptions are merely specific implementations of this application, but are not intended to limit the protection scope of this application. Various equivalent modifications or replacements readily figured out by a person skilled in the art within the technical scope disclosed in this application shall fall within the protection scope of this application. Therefore, the protection scope of this application shall be subject to the protection scope of the claims.

What is claimed is:

1. An operational amplifier comprising:
   a differential amplification circuit configured to:
      receive and amplify an input voltage to generate an output voltage;
      receive a feedback signal; and
      adjust a common-mode voltage of the output voltage based on the feedback signal;
   a reference voltage generation circuit comprising:
      a first metal-oxide-semiconductor (MOS) transistor, wherein a gate of the first MOS transistor is short-circuited to a drain of the first MOS transistor;
      a first bias circuit configured to provide a drain current to the first MOS transistor; and
      a first summation circuit, wherein an input terminal of the first summation circuit is configured to receive a drain voltage of the first MOS transistor and an operating voltage,
   wherein the reference voltage generation circuit is configured to:
      detect status information of the operational amplifier, wherein the status information comprises a temperature or an operating voltage of the operational amplifier; and
      generate a reference voltage based on the status information, wherein the reference voltage is a voltage at an output terminal of the first summation circuit; and
   a common-mode feedback circuit coupled to the differential amplification circuit and the reference voltage generation circuit and configured to:
      receive the output voltage and the reference voltage; and provide the feedback signal to the differential amplification circuit based on the output voltage and the reference voltage.

2. The operational amplifier of claim 1, wherein the reference voltage generation circuit comprises a voltage divider circuit that is located between a circuit point of the operating voltage and a ground, wherein the voltage divider circuit comprises a voltage divider node, and wherein the reference voltage is a voltage of the voltage divider node.

3. The operational amplifier of claim 1, wherein a process of the first MOS transistor is the same as that of other MOS transistors in the operational amplifier.

4. The operational amplifier of claim 1, wherein the common-mode feedback circuit comprises:
   a second summation circuit configured to:
      receive the output voltage; and
      generate the common-mode voltage based on the output voltage;
   a first level switching circuit coupled to the second summation circuit and configured to:
      receive the common-mode voltage; and
      convert the common-mode voltage to obtain a first voltage;
   a second level switching circuit configured to:
      receive the reference voltage; and
      convert the reference voltage to obtain a second voltage; and
   an amplification circuit coupled to the first level switching circuit and the second level switching circuit and comprising:
      input pair transistors comprising:
         a second metal-oxide-semiconductor (MOS) transistor, wherein a gate of the second MOS transistor is configured to receive the first voltage, and wherein the first voltage enables the second MOS transistor to operate in a saturation region; and
         a third MOS transistor, wherein a gate of the third MOS transistor is configured to receive the second voltage, and wherein the second voltage enables the third MOS transistor to operate in the saturation region; and
      an output terminal configured to generate the feedback signal.

5. The operational amplifier of claim 1, wherein the differential amplification circuit comprises K stages of amplification circuits, wherein a $(K-1)^{th}$ stage amplification circuit comprises a second bias circuit, wherein the second bias circuit comprises a fourth metal-oxide-semiconductor (MOS) transistor, wherein a gate of the fourth MOS transistor is configured to receive the feedback signal, and wherein k≥2.

6. The operational amplifier of claim 1, wherein the common-mode feedback circuit further comprises a filter circuit configured to:
   receive the common-mode voltage; and
   filter out a direct current component of the common-mode voltage to obtain a fast path feedback signal, wherein the fast path feedback signal is an alternating current component of the common-mode voltage.

7. The operational amplifier of claim 6, wherein the differential amplification circuit comprises K stages of amplification circuits, wherein a $K^{th}$ stage amplification circuit comprises a third bias circuit, wherein the third bias circuit comprises a fifth metal-oxide-semiconductor (MOS) transistor, wherein a gate of the fifth MOS transistor is configured to receive the fast path feedback signal, and wherein K≥2.

8. The operational amplifier of claim 7, wherein the common-mode voltage is directly coupled to the $K^{th}$ stage amplification circuit.

9. A chip comprising:
   an operational amplifier comprising:
      a differential amplification circuit configured to:
         receive and amplify an input voltage to generate an output voltage;
         receive a feedback signal; and
         adjust a common-mode voltage of the output voltage based on the feedback signal;
      a reference voltage generation circuit configured to:
         detect status information of the operational amplifier, wherein the status information comprises a temperature or an operating voltage of the operational amplifier; and
         generate a reference voltage based on the status information; and
      a common-mode feedback circuit coupled to the differential amplification circuit and the reference voltage generation circuit and configured to:
         receive the output voltage and the reference voltage; and
         provide the feedback signal to the differential amplification circuit based on the output voltage and the reference voltage,
      wherein the common-mode feedback circuit further comprises a filter circuit configured to:
         receive the common-mode voltage; and
         filter out a direct current component of the common-mode voltage to obtain a fast path feedback signal, wherein the fast path feedback signal is an alternating current component of the common-mode voltage.

10. The chip of claim 9, wherein the reference voltage generation circuit comprises:
   a first metal-oxide-semiconductor (MOS) transistor, wherein a gate of the first MOS transistor is short-circuited to a drain of the first MOS transistor, and wherein the reference voltage is a drain voltage of the first MOS transistor; and
   a first bias circuit configured to provide a drain current to the first MOS transistor.

11. The chip of claim 10, wherein a process of the first MOS transistor is the same as that of other MOS transistors in the operational amplifier.

12. The chip of claim 9, wherein the reference voltage generation circuit comprises a voltage divider circuit that is located between a circuit point of the operating voltage and a ground, wherein the voltage divider circuit comprises a voltage divider node, and wherein the reference voltage is a voltage of the voltage divider node.

13. The chip of claim 9, wherein the reference voltage generation circuit comprises:
   a first metal-oxide-semiconductor (MOS) transistor, wherein a gate of the first MOS transistor is short-circuited to a drain of the first MOS transistor;
   a first bias circuit configured to provide a drain current to the first MOS transistor; and
   a first summation circuit, wherein an input terminal of the first summation circuit is configured to receive a drain voltage of the first MOS transistor and the operating voltage, and wherein the reference voltage is a voltage at an output terminal of the first summation circuit.

14. The chip of claim 9, wherein the common-mode feedback circuit comprises:
   a second summation circuit configured to:

receive the output voltage; and
generate the common-mode voltage based on the output voltage;
a first level switching circuit coupled to the second summation circuit and configured to:
receive the common-mode voltage; and
convert the common-mode voltage to obtain a first voltage;
a second level switching circuit configured to:
receive the reference voltage; and
convert the reference voltage to obtain a second voltage; and
an amplification circuit coupled to the first level switching circuit and the second level switching circuit and comprising:
input pair transistors comprising:
a second metal-oxide-semiconductor (MOS) transistor, wherein a gate of the second MOS transistor is configured to receive the first voltage, and wherein the first voltage enables the second MOS transistor to operate in a saturation region; and
a third MOS transistor, wherein a gate of the third MOS transistor is configured to receive the second voltage, and wherein the second voltage enables the third MOS transistor to operate in the saturation region; and
an output terminal configured to generate the feedback signal.

15. The chip of claim 9, wherein the differential amplification circuit comprises K stages of amplification circuits, wherein a $(K-1)^{th}$ stage amplification circuit comprises a second bias circuit, wherein the second bias circuit comprises a fourth metal-oxide-semiconductor (MOS) transistor, wherein a gate of the fourth MOS transistor is configured to receive the feedback signal, and wherein k≥2.

16. The chip of claim 9, wherein the differential amplification circuit comprises K stages of amplification circuits, wherein a $K^{th}$ stage amplification circuit comprises a third bias circuit, wherein the third bias circuit comprises a fifth metal-oxide-semiconductor (MOS) transistor, wherein a gate of the fifth MOS transistor is configured to receive the fast path feedback signal, and wherein K≥2.

17. The chip of claim 16, wherein the common-mode voltage is directly coupled to the $K^{th}$ stage amplification circuit.

18. A chip comprising:
an operational amplifier comprising:
a differential amplification circuit configured to:
receive and amplify an input voltage to generate an output voltage;
receive a feedback signal; and
adjust a common-mode voltage of the output voltage based on the feedback signal;
a reference voltage generation circuit configured to:
detect status information of the operational amplifier, wherein the status information comprises a temperature or an operating voltage of the operational amplifier; and
generate a reference voltage based on the status information; and
a common-mode feedback circuit coupled to the differential amplification circuit and the reference voltage generation circuit and configured to:
receive the output voltage and the reference voltage; and
provide the feedback signal to the differential amplification circuit based on the output voltage and the reference voltage,
wherein the differential amplification circuit comprises K stages of amplification circuits, wherein a $(K-1)^{th}$ stage amplification circuit comprises a second bias circuit, wherein the second bias circuit comprises a fourth metal-oxide-semiconductor (MOS) transistor, wherein a gate of the fourth MOS transistor is configured to receive the feedback signal, and wherein k≥2.

19. A chip comprising:
an operational amplifier comprising:
a differential amplification circuit configured to:
receive and amplify an input voltage to generate an output voltage;
receive a feedback signal; and
adjust a common-mode voltage of the output voltage based on the feedback signal;
a reference voltage generation circuit configured to:
detect status information of the operational amplifier, wherein the status information comprises a temperature or an operating voltage of the operational amplifier; and
generate a reference voltage based on the status information; and
a common-mode feedback circuit coupled to the differential amplification circuit and the reference voltage generation circuit and configured to:
receive the output voltage and the reference voltage; and
provide the feedback signal to the differential amplification circuit based on the output voltage and the reference voltage,
wherein the differential amplification circuit comprises K stages of amplification circuits, wherein a $K^{th}$ stage amplification circuit comprises a third bias circuit, wherein the third bias circuit comprises a fifth metal-oxide-semiconductor (MOS) transistor, wherein a gate of the fifth MOS transistor is configured to receive the fast path feedback signal, and wherein K≥2.

20. The chip of claim 19, wherein the common-mode voltage is directly coupled to the $K^{th}$ stage amplification circuit.

* * * * *